United States Patent [19]
Katayama

[11] Patent Number: 5,769,695
[45] Date of Patent: Jun. 23, 1998

[54] CHAMFER GRINDING SYSTEM FOR WAFER

[75] Inventor: Ichiro Katayama, Mitaka, Japan

[73] Assignee: Tokyo Seimitsu Co., Ltd., Tokyo, Japan

[21] Appl. No.: 865,048

[22] Filed: May 29, 1997

Related U.S. Application Data

[63] Continuation of Ser. No. 560,931, Nov. 20, 1995, abandoned.

[30] Foreign Application Priority Data

Nov. 28, 1994 [JP] Japan .................................. 6-317608

[51] Int. Cl.$^6$ ........................................................ B24B 5/00
[52] U.S. Cl. ............................................ 451/290; 451/287
[58] Field of Search .................................. 451/41, 44, 57, 451/66, 180, 239, 254, 146, 5, 287–292

[56] References Cited

U.S. PATENT DOCUMENTS

| | | | |
|---|---|---|---|
| 3,665,648 | 5/1972 | Yamanaka | 451/292 |
| 4,638,601 | 1/1987 | Steere et al. . | |
| 4,693,036 | 9/1987 | Mori | 451/289 |
| 4,753,045 | 6/1988 | Fetouh et al. | 451/292 |
| 4,829,716 | 5/1989 | Ueda et al. | 451/292 |
| 4,982,827 | 1/1991 | Seitz et al. . | |
| 5,516,327 | 5/1996 | Kawasaki | 451/288 |
| 5,547,415 | 8/1996 | Hasegawa et al. | 451/44 |

FOREIGN PATENT DOCUMENTS

| | | |
|---|---|---|
| 0 222 521 | 5/1987 | European Pat. Off. . |
| 0 354 586 | 2/1990 | European Pat. Off. . |
| 59-214554 | 12/1984 | Japan . |
| 2-30464 | 1/1990 | Japan . |
| 1 255 939 | 12/1971 | United Kingdom . |
| 1 365 142 | 8/1974 | United Kingdom . |

OTHER PUBLICATIONS

Metalworking Production, Nov. 4, 1968 "Bolt Production".

Dr.–Ing. C. Büchek, Neckarsulm "Die Organisation automatischer Fertigungen", pp. 698–703; Jun. 15, 1956.

*Primary Examiner*—Timothy V. Eley
*Assistant Examiner*—Derris H. Banks
*Attorney, Agent, or Firm*—Sixbey, Friedman, Leedom & Ferguson; David S. Safran

[57] ABSTRACT

Picking up means pick up a wafer from a first cassette one by one and carry the wafer to a pre-processing means. The wafer is picked up from the pre-processing means after the measuring and deciding the position has been completed in the pre-processing means. First carrying means receives the wafer from the picking up means and resets the position of the wafer. The first carrying means mounts the wafer on the wafer table of the first chamfering means in the case that the first chamfering part is not chamfering the wafer. The first carrying means carries the wafer and mounts it on the second wafer table of the second chamfering means in the case that the first chamfering part is chamfering the wafer.

8 Claims, 9 Drawing Sheets

CHAMFER GRINDING SYSTEM FOR WAFER

This application is a continuation of application Ser. No. 08/560,931, filed Nov. 20, 1995, now abandoned.

BACKGROUND OF THE INVENTION

1. Field of the Invention

The present invention relates to a chamfer grinding system for a wafer and more particularly to a chamfer grinding system for chamfering a periphery of the wafer made of silicon and the like which is a material for semiconductor element.

2. Description of the Related Art

A material for a semiconductor element such as a silicon ingot are sliced into wafers by means of a slicing machine, then, a periphery of the sliced wafer is chamfered by a chamfer grinding machine. An orientation flat and/or a notch is provided at the periphery of the wafer for positioning and/or understanding a crystal orientation etc. The orientation flat and the notch are to be chamfered as well as the periphery (a circular part which is the part except for the orientation flat or the notch).

FIG. 6 shows a wafer 10 including the orientation flat 12, where D is a diameter of the wafer and L is a span of the wafer with taking account of the orientation flat 12.

FIG. 7 describes a wafer 11 including the notch 13, where D is a diameter of the wafer and $\alpha$ is a opening angle of the notch, $\delta$ is an angle indicating a position of the notch 13 in the periphery of the wafer 11, and M is a span of the wafer 11 with taking account of the notch 13 (a circle at the notch is applied for convenience so as to indicate the span in the FIG. 7, and the circle is not included in the wafer).

FIG. 8 shows a sectional shape of a chamfered wafer. In FIG. 8, T is a thickness of the wafer, Bu and Bl are breadths of a chamfered portion, Ru and R1 are radius for corners, $\theta u$ and $\theta 1$ are taper angles, and t is a thickness of a flat portion of the periphery. The above-described D, L, M, Bu. should satisfy allowable values for each value.

For chamfering a wafer, it is necessary to know a thickness of the wafer so as to correctly position wafer and a grinding stone in a vertical direction. Also, the wafer should be fixed on a wafer table in such a manner that a center of wafer is coincided with a rotational center of a wafer table. Similarly, the position of the orientation flat 12 or the notch 13 should be decided correctly. Therefore, a chamfer grinding machine measures the thickness of the wafer, and positions a center of the wafer and the orientation flat 12 or the notch 13 correctly.

There are two kinds of grindstones for chamfering, that is, a trapezoid grindstone 42a shown in FIG. 9 and a grindstone 42b for form turning shown in FIG. 10. In the case of the grindstone 42a, the wafer 10 and the grindstone 42a is relatively moved in the vertical direction, and each side of the wafer is pressed against a tapered portion of the grindstone 42a one side by one. On the other hand, the shape of the outer side of the grindstone 42b has a shape as same as that of the chamfered wafer, so both sides of the wafer can be chamfered only by pushing the wafer into the grindstone 42b. The grindstones of FIGS. 9 and 10 are used for chamfering the outer periphery and the orientation flat 12. The grindstone for notch has the same shape of the outer periphery as that for the outer periphery and the orientation flat. Ordinarily, grindstones are prepared for a rough edge grinding and a fine edge grinding respectively. Also, it is possible to integrate the rough grindstone and the fine grindstone into one grindstone.

FIG. 11 is a plan view showing one embodiment of a chamfer grinding system and FIG. 12 is an explanatory view of the system.

Two supplying parts 20 and 20 and pre-processing means 30 are arranged as shown in FIGS. 11 and 12. Wafers 10 (11) has not been chamfered and are housed in cassettes 21. The cassettes 21 are mounted on the supplying parts 20.

Picking up means 80 is arranged in a part enclosed by two supplying parts 20 and the pre-processing means 30. An arm 81 of the picking up means 80 can be horizontally and vertically moved and rotated. The wafers 10 (11) are picked up and carried by the arm 81 from the cassette 21 to the pre-processing means 30 one by one.

A thickness of the wafer 10 (11) are measured and the position of the orientation flat 12 or a notch 13 of the wafer is roughly decided at the pre-processing means 30.

Chamfering means 40 is arranged next to the pre-processing means 30, and cleaning means 50 is provided next to the chamfering means 40. First carrying means 120 is arranged above a wafer table 41 of the chamfering means 40 and the first carrying means 120 can move vertically. After the processing of the pre-processing means 30, the wafer 10 (11) is picked up from the pre-processing means 30 and carried up to a position above the wafer table 41 of the chamfering means 40 by the picking up means 80. Then, the first carrying means 120 receives the wafer 10 (11).

The wafer 10 (11) is supported by two rollers 121 and one positioning piece 122 of the first carrying means 120, so that the position of the orientation flat 12 or a notch 13 of the wafer 10 (11) is reset correctly. Then, the first carrying means 120 mounts the wafer 10 (11) on the wafer table 41 of the chamfering means 40, and the wafer 10 (11) is fixed on the wafer table 41 by vacuum absorption, etc., so that the wafer is chamfered.

Second carrying means 130 can move between the chamfering means 40 and the cleaning means 50, and can also move vertically. After the wafer 10 (11) is chamfered by the chamfering means 40, the wafer 10 (11) is supported by four rollers 131 of the second carrying means 130, and the wafer is carried from the wafer table 41 to the cleaning means 50 for cleaning.

Storing means 110 is arranged next to the cleaning means 50. Inspection means 60 and two housing means 70 are arranged around the storing means 110. Cassettes 71 for housing the chamfered wafer 10 (11) are mounted on the housing means 71. An arm 111 of the storing means 110 can be horizontally and vertically moved and rotated just as the arm 81 of the picking up means 80.

When the cleaning is completed, the wafer 10 (11) is picked up from the cleaning means 50 and carried to the inspection means 60 by the storing means 110. A sectional shape and a diameter, etc. of the chamfered wafer 10 (11) are inspected at the inspection means 60. After the measurement is completed, the wafer 10 (11) is housed by the storing means 110 in the cassette 71 which is mounted on the housing means 70.

Regarding a time for an operation, generally, time for chamfering is the longest compared with time for picking up the wafer from the cassette 21, a time for pre-processing, time for washing, time for measuring, time for storing wafer and the like in the cassette 71 in the above-described chamfer grinding system. Accordingly, a throughput (the number of wafers which can be chamfered per hour) of the system depends most on the time for chamfering.

Here, it is possible to provide the grindstone 42 for chamfering the outer periphery and the orientation flat 12, and grindstone 43 for chamfering the notch 13 respectively within the chamfering means 40 of the above-described chamfer grinding system as shown in FIG. 12. In this case, however, in order to carry out the rough edge grinding and the fine edge grinding within one chamfering means, two or more grindstones are required and an user has to exchange one grindstone with another in accordance with his purpose. Therefore, the operational time becomes longer. As a result, there is problem in that a lot of wafers can not be chamfered (the throughput is small) within a predetermined time.

Moreover, it is possible to prepare some chamfer grinding systems, for example, one system is for chamfering the wafer including the orientation flat, one is for chamfering the wafer including the notch, one is for the rough edge grinding, and the other is for the fine edge grinding and the like. Further, it is also possible to provide some chamfering means within the chamfer grinding system, for example, one chamfering means is for chamfering the wafer including the orientation flat, another is for chamfering the wafer including the notch.

However, if the chamfering is carried out in each of two or more chamfer grinding systems, or if the chamfering is carried out by two or more chamfering means provided within one chamfer grinding system, the position of the orientation flat or the notch of the wafer should be decided for every chamfering operations. It is difficult to correctly decide the position of the wafer's center and the orientation flat or the notch at second chamfering time as same as at first chamfering time. Therefore, a precise chamfering and the fine edge grinding is not able to be performed well. As a result, there is problem in that an accuracy of the chamfered wafer is deteriorated. Further, in this case, there is a problem in that the cost of equipments and the area for an installment are increased.

As has been described, when the whole chamfering operation is carried out by one chamfering means in order to improve a chamfering accuracy, there is problem in that the throughput is to be small. When the chamfering is carried out in two or more chamfer grinding systems or by two or more chamfering means in order to enlarge the throughput, there is a problem in that the chamfering accuracy is deteriorated.

SUMMARY OF THE INVENTION

The present invention has been developed in view of the above-described circumstances, and has its aim the provision of a chamfer grinding system for a wafer wherein an accuracy for chamfering an outer periphery of the wafer is high and a throughput is large.

In order to achieve the above-mentioned object, the chamfer grinding system for the wafer according to the present invention mainly comprising, at least one supplying part, at least one housing part, at least one pre-processing means, first chamfering means, second chamfering means, picking up means, first carrying means, and storing means.

At least one first cassette for housing a plurality of wafers is mounted on the supplying part. The wafers has not been chamfered.

At least one second cassette for housing a plurality of wafers is mounted on the housing part.

The pre-processing means measures a thickness of the wafer and decides a position of the wafer.

The first chamfering means includes a rotatable first wafer table and at least one rotatable grindstone. The first wafer table and the grindstone gets closer to each other so as to chamfer the wafer.

The second chamfering means also includes a rotatable second wafer table and at least one rotatable grindstone. The second wafer table and the grindstone gets closer to each other so as to chamfer the wafer.

The picking up means picks up the wafer from the first cassette one by one and carries the wafer to the pre-processing means. After the measuring and deciding the position of the pre-processing mean is completed, the picking up means picks up the wafer from the pre-processing means.

The first carrying means receives the wafer from the first picking up means and mounts the wafer on the first wafer table in the case that the first chamfering means is not chamfering the wafer. The first carrying means carries the wafer to the second chamfering means and mounts the wafer on the second wafer table in the case that the first chamfering means is chamfering the wafer.

The storing means picks up the chamfered wafer from the first wafer table and the second wafer table. Then, the storing means stores the wafer in the second cassette.

In the chamfer grinding system of the present invention, the wafers are chamfered by not only the first chamfering means but also the second chamfering means. As a result, a lot of wafers are chamfered in a predetermined time, so that the throughput can be enlarged.

According to a preferred embodiment of the chamfer grinding system for a wafer of the present invention, the pre-processing part roughly measures the thickness of the wafer and roughly decides the position of the wafer. The first carrying means correctly resets the position of the wafer when the first carrying means receives the wafer from the first picking up means.

Further, according to another preferred embodiment of the chamfer grinding system for the wafer of the present invention further comprises cleaning means, inspection means, and second carrying means. The cleaning means cleans the wafer having been chamfered. The inspection means inspecting the wafer having been chamfered and cleaned. The second carrying means carries the wafer from the first wafer table to the cleaning means when the chamfering is completed in the first chamfering means. The second carrying means also carries the wafer from the second wafer table to the cleaning means when the chamfering i is completed n the second chamfering means. Further, the storing means picks up the wafer from the cleaning means and carries the wafer to the inspection means after the cleaning of the wafer is completed in the cleaning means. The storing means picks up the wafer from the inspection means and stores the wafer in the second cassette after the inspection in the inspection means is completed.

Regarding the first and the second chamfering means, it is possible provided a rotatable grindstone for chamfering a outer periphery and the orientation flat of a wafer and a rotatable grindstone for chamfering a notch of a wafer with the first and the second chamfering means respectively. It is also possible to provide a rotatable grindstone for a rough edge grinding of the wafer, and a rotatable grindstone for a fine edge grinding of the wafer with the first and the second chamfering means respectively.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures and wherein.

DESCRIPTION OF THE PREFERRED EMBODIMENT

Detailed description will hereunder be given of the preferred embodiment of a chamfer grinding system for a wafer according to the present invention with reference to the accompanying drawings.

Figure 1:
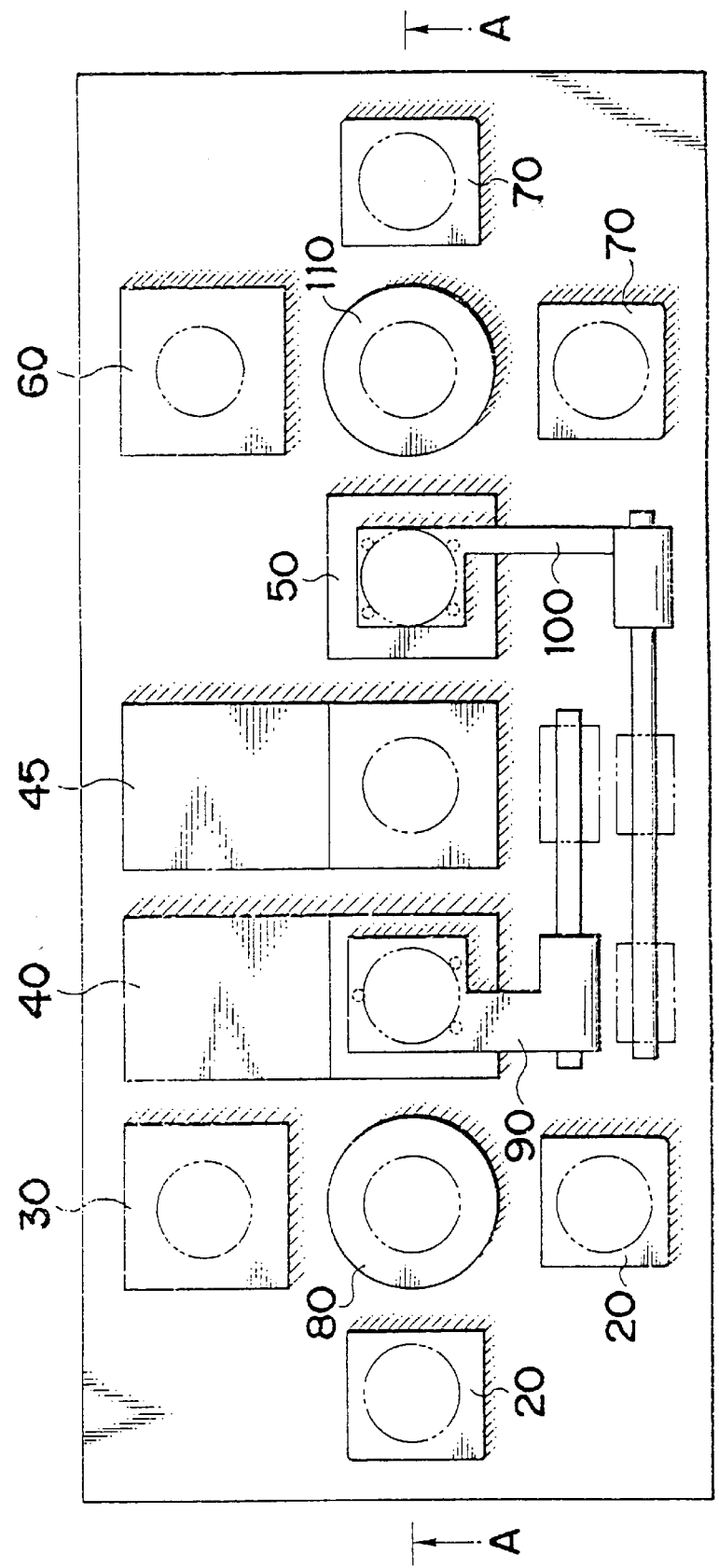
FIG. 1 is a plan view explaining an whole arrangement of an embodiment of a wafer chamfering system according to the present invention.
Figure 2:
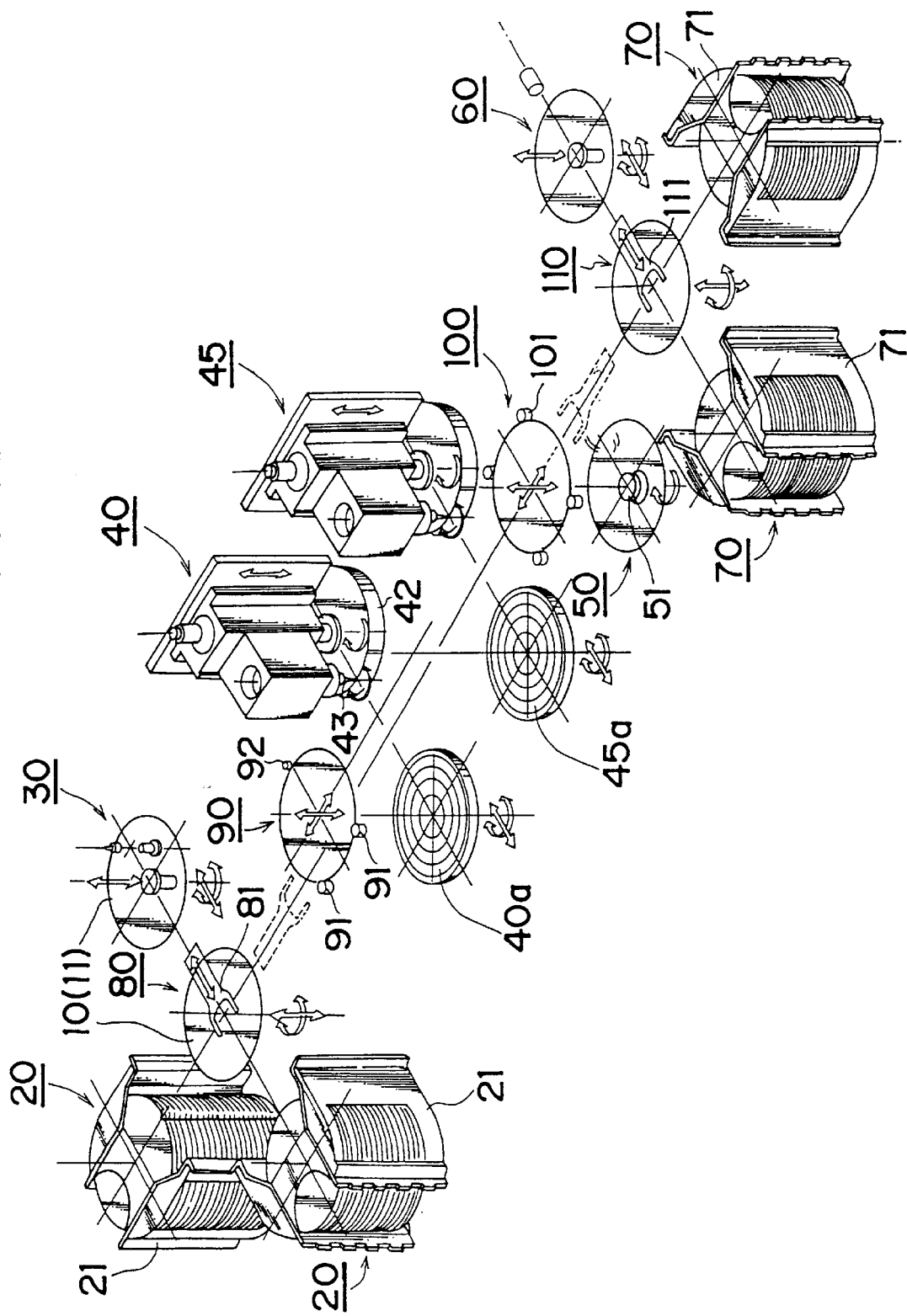
FIG. 2 is an view explaining a transport sequence of a wafer in an embodiment of the wafer chamfering system according to the present invention.
Figure 3:
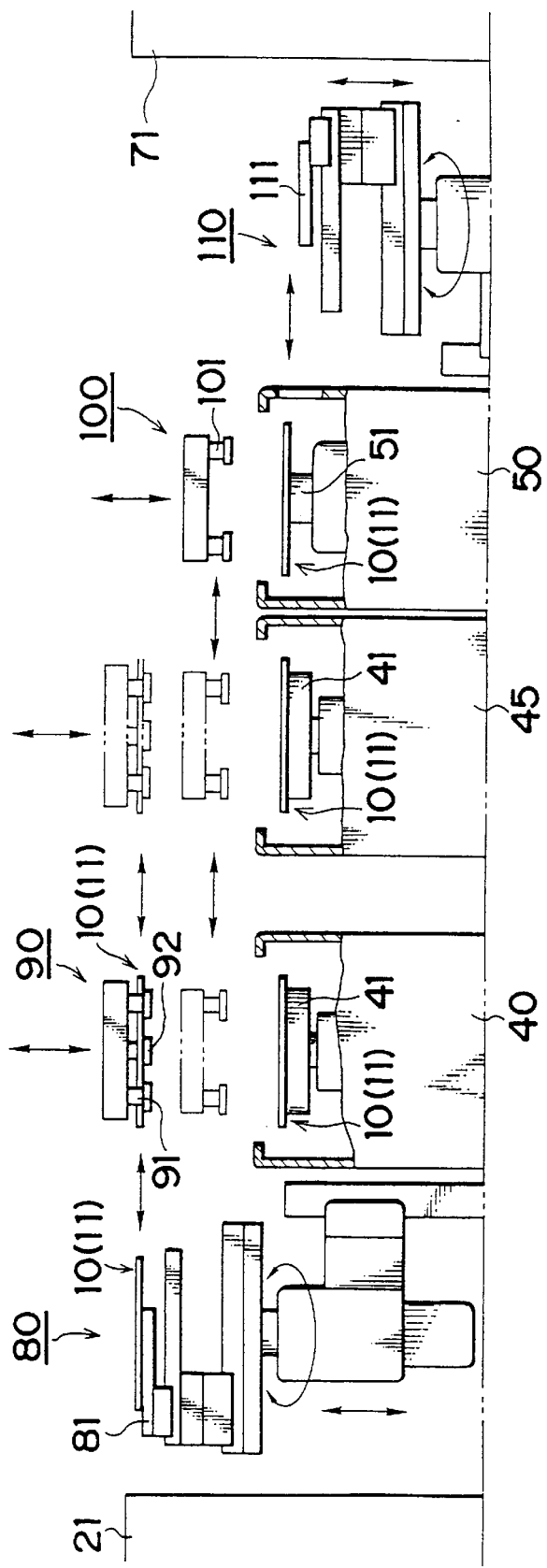
FIG. 3 is an sectional view explaining main parts of an embodiment of a wafer chamfering system according to the present invention.
Figure 11:
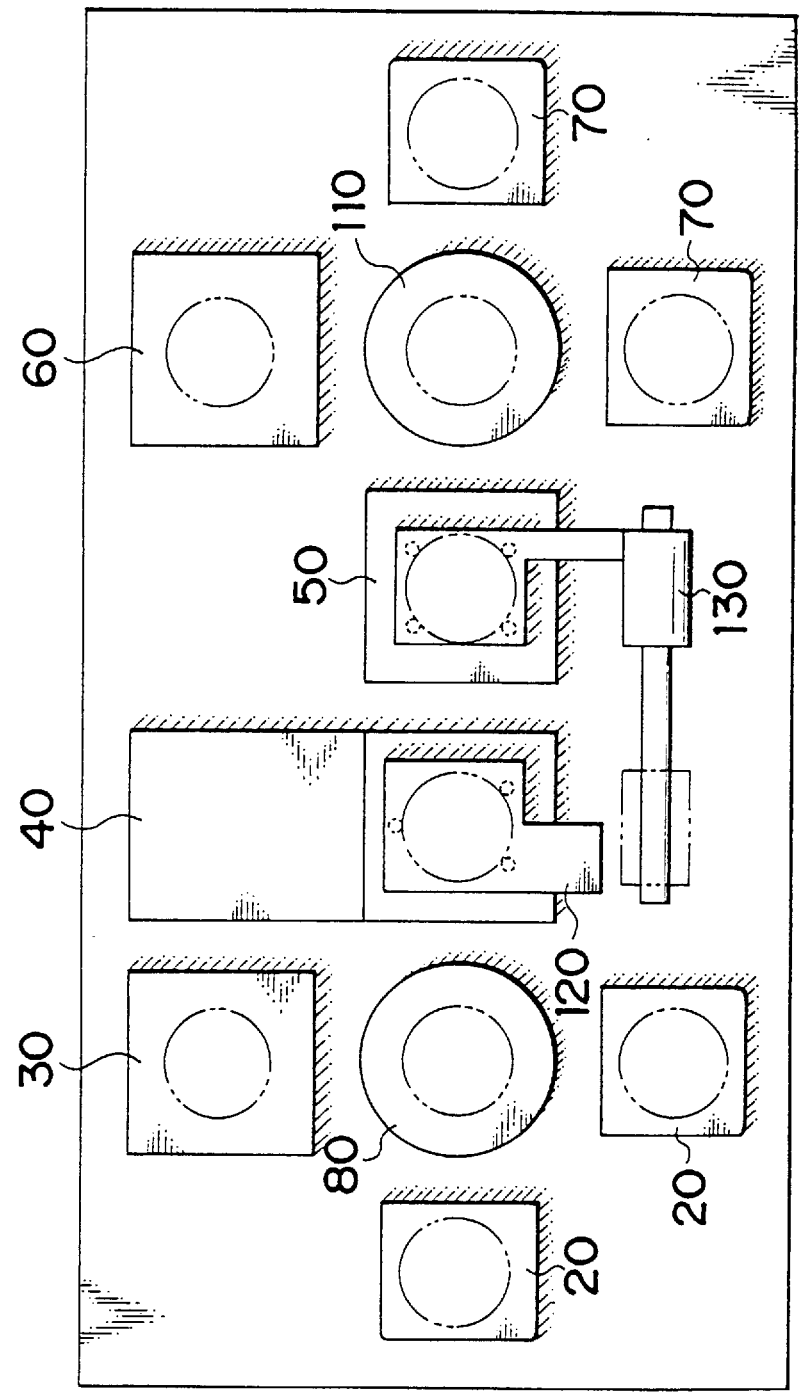
FIG. 11 is a plan view explaining an whole arrangement of a wafer chamfering system.
Figure 12:
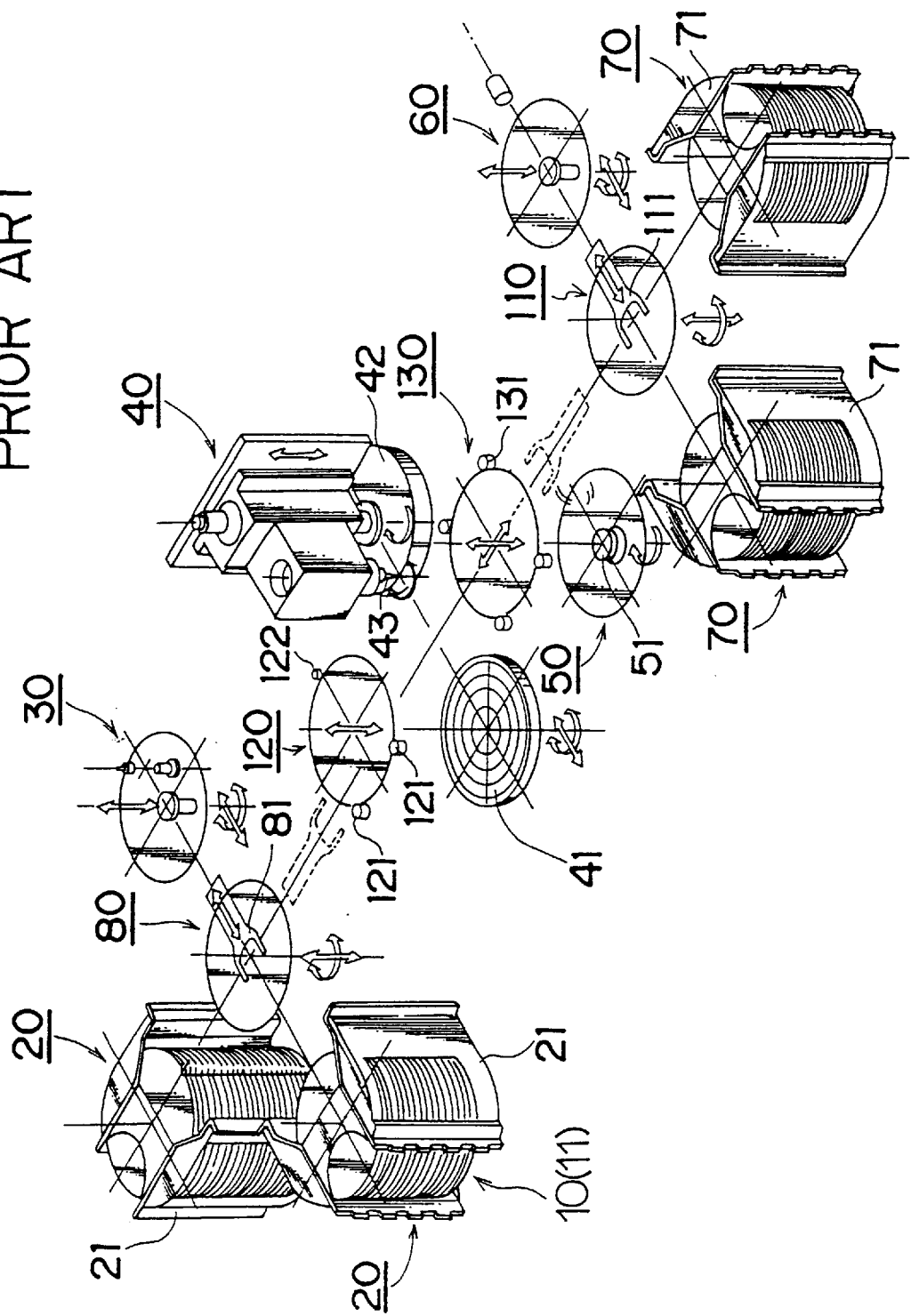
FIG. 12 is an view explaining a transport sequence of a wafer in the conventional chamfer grinding system.

FIG. 1 is a plan view explaining an whole arrangement of an embodiment of a wafer chamfering system according to the present invention. FIG. 2 is an view explaining a transport sequence of a wafer. FIG. 3 is an sectional view explaining main parts of the chamfer grinding system (upper part of A—A section of FIG. 1). The chamfer grinding system of this embodiment mainly comprises two supplying parts 20 and 20, picking up means 80, pre-processing means 30, first chamfering means 40, second chamfering means 45, cleaning means 50, first carrying means 90, second carrying means 100, inspection means 60, storing means 110 and two housing parts 70 and 70. That is, the chamfer grinding system of this embodiment is different from a chamfer grinding system of FIGS. 11 and 12 in that two chamfering means 40 and 45, the first carrying means 90, and the second carrying means 100 are provided. Other parts are the same as those of the chamfer grinding system of FIGS. 11 and 12, so the same marks are put on the parts of the same function, and an explanation of them is omitted here.

The first chamfering means 40 is arranged next to the pre-processing means 30, and the second chamfering means 45 is provided next to the first chamfering means 40. In this embodiment, the first and the second chamfering means 40 and 45 has the same construction, that is a grindstone 42 for chamfering the outer periphery and the orientation flat, and grindstone 43 for chamfering the notch are respectively provided with the first and second chamfering means 40 and 45.

The first carrying means 90 can be moved vertically above a wafer table 40a of the first chamfering means 40 and above a wafer table 45a of the second chamfering means 45. Also, the first carrying means 90 can be moved between the wafer table 40a and the wafer table 45a. The first carrying means 90 includes two rollers 91 and one positioning piece 92. The wafer is horizontally picked up by the arm 81 and is received by a flange below the rollers 91 and the positioning piece 92. The first carrying means 90 supports the wafer with the rollers 91 and the positioning piece 92 so as to decide the position of the wafer correctly.

The second carrying means 100 can move vertically and horizontally between the first chamfering means 40 and the cleaning means 50, and between the second chamfering means 45 and the cleaning means 50. The wafer 10 (11) is supported by four rollers 101 of the second carrying means 100. Incidentally, as shown in FIG. 3, the upper limit of the movement of the chamfering means 90 is higher than that of the second carrying means 100, as a result, each of the chamfering means 90 and the second carrying means 100 can horizontally move without an interference.

Next, an explanation will hereunder be given of the operation of the chamfer grinding system being constructed in the above-mentioned manner.

A plurality of wafers 10 including a orientation flat or wafers 11 including a notch has not been chamfered and are housed in cassettes 21. The cassettes 21 are mounted on the supplying parts 20. The (first) wafer 10 (11) is picked up by the arm 81 and carried from the cassette 21 to the pre-processing means 30. A thickness of the wafer 10 (11) are measured and the position of the orientation flat or a notch of the wafer is roughly decided at the pre-processing means 30.

After the processing of the pre-processing means 30, the wafer 10 (11) is transported up to a position above the wafer table 40a of the first chamfering means 40 by the picking up means 80, and the wafer is received by the first carrying means 90. The wafer 10 (11) is supported by two rollers 91 and one positioning piece 92 of the first carrying means 90, so that the position of the orientation flat or a notch of the wafer 10 (11) is reset correctly. Then, the first carrying means 90 mounts the wafer 10 (11) on the wafer table 40a of the first chamfering means 40, and the wafer 10 (11) is fixed on the wafer table 40a by vacuum absorption, etc., so that the wafer is chamfered.

The picking up means 80 returns near the supplying parts 20. The picking up means 80 picks up the (second) wafer 10 (11) which is to be chamfered next. The second wafer 10 (11) is delivered to the first carrying means 90 as has been described. Here, in the case that the first chamfering means 40 is chamfering the first wafer 10 (11), the first carrying means 90 carries the second wafer 10 (11) up to the second chamfering means 45. The second wafer 10 (11) is chamfered in the second chamfering means 45.

As has mentioned above, the wafers 10 (11) are picked up from the cassettes 21 and carried to the first chamfering means 40 or the second chamfering means 45 and chamfered one by one.

After the wafer 10 (11) is chamfered in the chamfering means 40 or the chamfering means 45, the wafer 10 (11) is supported by four rollers 101 of the second carrying means 100, and the wafer is carried from the wafer table 40a or the wafer table 45a to the cleaning means 50 for cleaning.

When the cleaning is completed, the arm 111 of the storing means 110 horizontally moves so as to support the wafer 10 (11), and the arm 111 slightly rises. Then, the wafer 10 (11) is carried from a table 51 of the cleaning means 50 to the inspection means 60.

At the inspection means 60, a sectional shape and a diameter, etc. of the chamfered wafer 10 (11) are inspected. After the inspection is completed, the wafer 10 (11) is housed by the storing means 110 in the cassette 71 which is set on the housing means 70.

Figure 4:
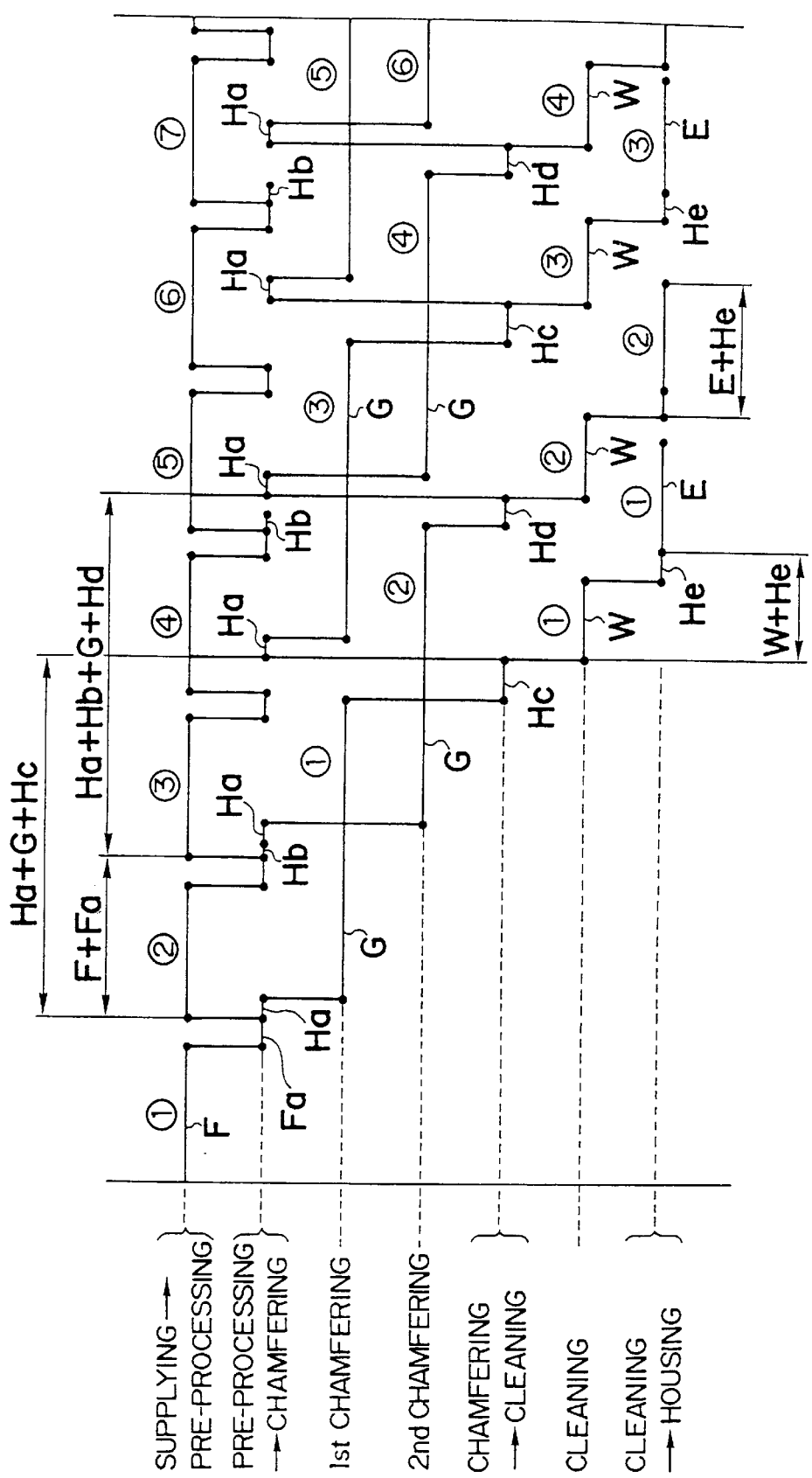
FIG. 4 is a time chart illustrating operational time of each part in the system.
Figure 5:
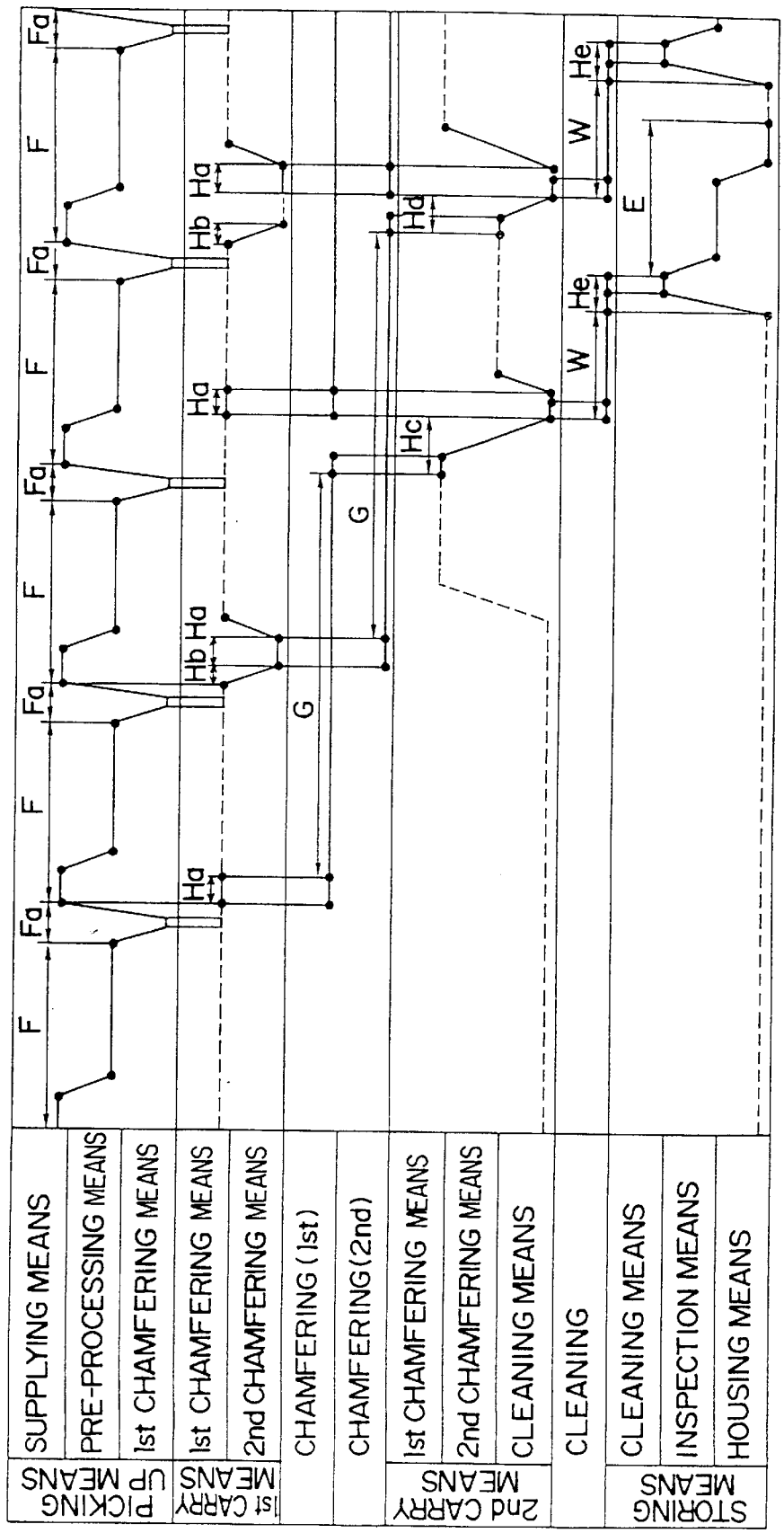
FIG. 5 is a detailed time chart of each part in the system.
Figure 6:
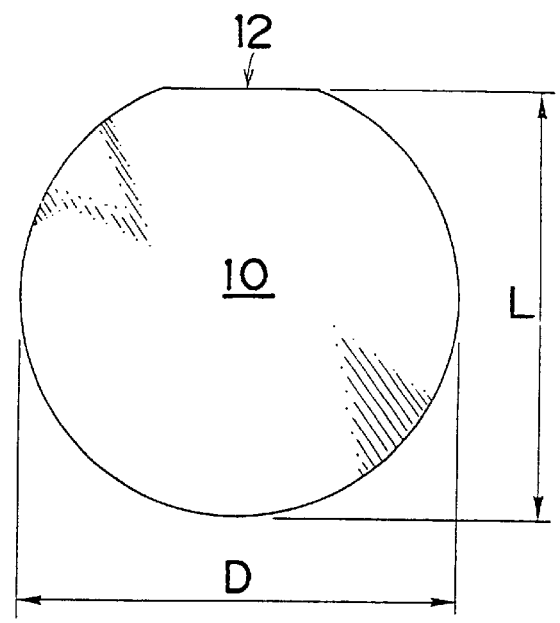
FIG. 6 is a view illustrating an external appearance of a wafer including an orientation flat.
Figure 7:
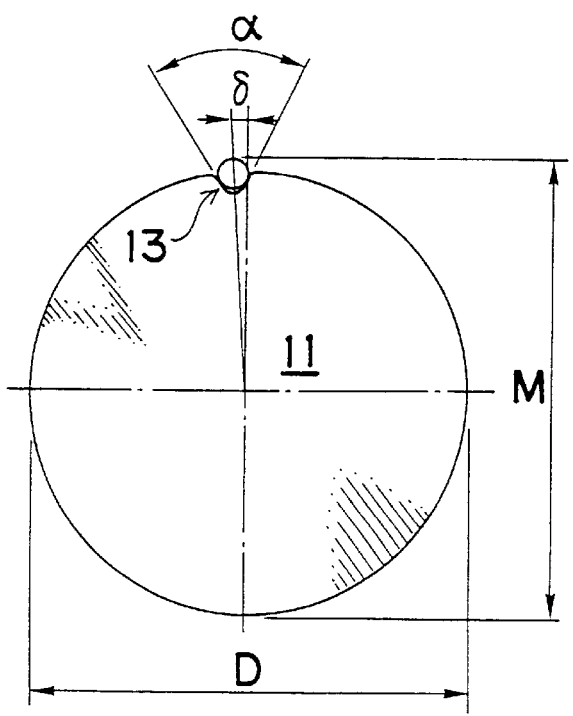
FIG. 7 is a view illustrating an external appearance of a wafer including a notch.
Figure 8:
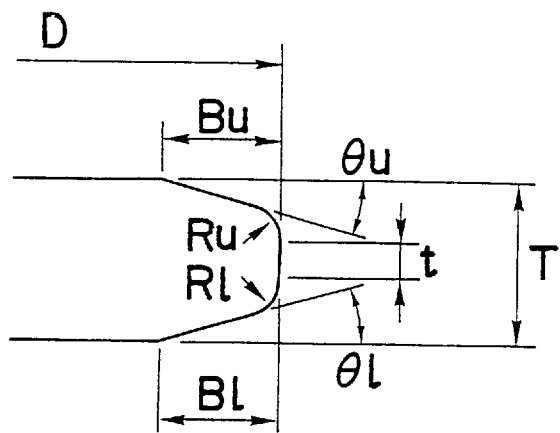
FIG. 8 illustrating a sectional shape of a chamfered wafer.
Figure 9:
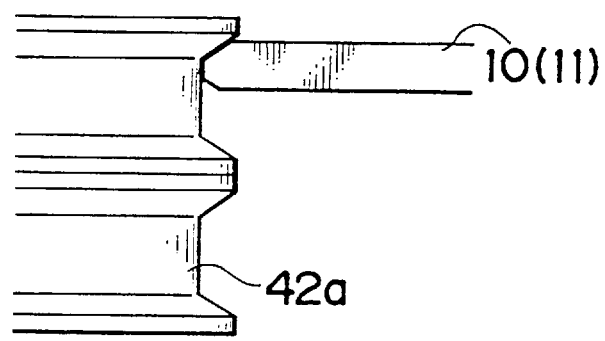
FIG. 9 is a view illustrating a shape of an outer periphery of a trapezoid grindstone.
Figure 10:
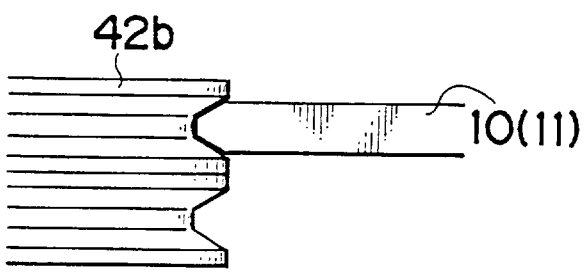
FIG. 10 is a view illustrating a shape of an outer periphery of a grindstone for form turning.

Next, an explanation will be given of operational time of the chamfer grinding system being constructed in the above-mentioned manner. FIG. 4 is a time chart illustrating operational time of each part in the system. FIG. 5 is a detailed time chart of each part in the system. Because the operational time of the pre-processing means 30 and the inspection means 60 are respectively included in the operational time of the picking up means 80 and the storing means 110, so the operational time of the pre-processing means 30 and the inspection means 60 are not mentioned about in FIG. 4 and 5.

In FIG. 5, when the arm 81 of the picking up means 80 is located near the supplying parts 20 at first, the arm 81 picks up one wafer 10 (11) from the cassette 21 and carried it to the pre-processing means 30. The picking up means 80 is located near the pre-processing means 30 until the thickness of the wafer 10 (11) is measured and the position of the orientation flat or the notch is roughly set by the pre-processing means 30. The time for the above-mentioned operation (from picking up the wafer to the completion of the pre-processing) is referred to as F.

When the measurement of the thickness and the setting of the position of the wafer 10 (11) are completed, the picking up means 80 carries the wafer 10 (11) up to the first carrying means 90 which locates above the wafer table 40a of the first chamfering means 40, so that the wafer 10 (11) is mounted on the first carrying means 90. Then, the picking up means 80 returns to near the supplying parts 20. The time required for the above-mentioned operations is referred to as Fa.

The first carrying means 90 correctly decides the position of the wafer 10 (11), and mounts it on the wafer table 40a of the chamfering means 40. The time required for the above-mentioned operation is referred to as Ha.

As has been described, the picking up means 80 returns near the supplying parts 20 and picks up the (second) wafer 10 (11) which is to be chamfered next. The second wafer 10 (11) is carried to the first carrying means 90. In the case that the first chamfering means 40 is chamfering the first wafer 10 (11), the first carrying means 90 carries the second wafer 10 (11) up to the second chamfering means 45. The time for carrying the wafer 10 (11) from the first chamfering means 40 to the second chamfering means 45 is referred to as Hb. Incidentally, the time required for mounting the wafer on the wafer table 45a (from the first carrying means 90) is Ha just in the case of the chamfering is carried out in the first chamfering means 40.

The time required for chamfering in the first and the second chamfering means 40 and 45 is referred to as G.

When the chamfering is completed in the first chamfering means 40, the second carrying means 100 picks up the chamfered wafer 10 (11) from the wafer table 40a and carries it up to the cleaning means 50. The time for carrying the wafer 10 (11) from the wafer table 40a to the cleaning means 50 is referred to as Hc.

Similarly, the time for carrying the wafer 10 (11) from the wafer table 45a to the cleaning means 50 is referred to as Hd.

After the chamfered wafer 10 (11) is mounted the table 51 of cleaning means 50, the wafer 10 (11) is cleaned by the cleaning means 50. The time for mounting the wafer 10 (11) on the table 51 and for cleaning is referred to as W.

When the cleaning is completed, the arm 111 of the storing means 110 moves up to the cleaning means 50, and picks up the cleaned wafer 10 (11) from the cleaning means 50. The time for this operation is referred to as He.

After the storing means 110 picks up the cleaned wafer 10 (11) from the cleaning means 50, the storing means 110 carries the wafer 10 (11) up to the inspection means 60. When the inspection is completed in the inspection means 60, the wafer 10 (11) is housed in the cassette 71 mounted on the housing means 70. The time required for the above-mentioned operation (transportation, inspection and housing) is referred to as E.

In the FIG. 4, the number put on each time line indicates wafers to be processed (1 is the first wafer, 2 is the second wafer, etc.).

As shown in FIG. 4, it takes F+Fa for the operation in which the picking up means 80 picks up the wafer 10 (11) from the cassette 21, mounts it on the first carrying means 90 and returns. It takes Ha+G+Hc for the operation in which the first carrying means 90 receives the wafer 10 (11) and the second carrying means 100 carries the chamfered wafer 10 (11) up to the cleaning means 50. It takes W+He for the operation in which the second carrying means 100 mounts the wafer 10 (11) in the cleaning means 50 and the storing means 110 picks up the wafer 10 (11) after the cleaning. It takes E+He for the operation in which the storing means 110 picks up the wafer 10 (11) and houses it in the cassette 71. Incidentally, FIG. 4 shows that the time for the chamfering is Ha+Hb+G+Hd in the chamfering means 45, which is almost equal to the time for the chamfering in the chamfering means 40. Further, because the first carrying means 90 and the second carrying means 100 do not take much time for moving to next position after mounting the wafer, it is not taken into consideration.

From the above description, a maximum number of the chamfering means in one system is an integer N which is smaller than following values Na, Nb and Nc (N≦Na, Nb, Nc).

$$Na=(Ha+G+Hc)/(F+Fa) \quad (1)$$

$$Nb=(Ha+G+Hc)/(W+He) \quad (2)$$

$$Nc=(Ha+G+Hc)/(E+He) \quad (3)$$

The average processing time for one wafer is as follows:

$$ST=(Ha+G+Hc)/N \quad (4)$$

Incidentally, in the above-mentioned embodiment, the chamfering time is the longest, and is more than twice but less than three times as long as the longest of other working time (F+Fa, W+He, and E+He). If the chamfering time is more than three times of (F+Fa, W+He, and E+He), the number of the chamfering means may be increased to three or more, and a distance for that movement of the first carrying part 90 and the second carrying part 100 in a horizontal direction may be increased.

Likewise, in the case that the cleaning time is long so that N is larger than Nb but smaller than Na and Nc (Nb<N<Na, Nc), another cleaning part 50 may be additionally provided, and a distance for the movement of the second carrying part 100 in a horizontal direction may be increased, so that the average processing time for one wafer can be ST.

Moreover, in the case that N is larger than Na but smaller than Nb and Nc (Na<N<Nb, Nc) because it takes long time for the operation in which the wafer 10 (11) is picked up from the cassette 21 and the operation for the pre-processing means 30, the supplying part 20 and the pre-processing means 30 may be additionally provided, or the functions of the pre-processing means 30 may be separated into the measurement of the thickness and the rough-positioning of the wafer. In this case, an angle formed by the supplying part 20 and the pre-processing means 30 may be approximately 60°, if, for example, a total number of supplying parts 20 and the pre-processing means 30 is 4. Incidentally the angle is set at approximately 90° in this embodiment.

Likewise, in the case that N is larger than Nc but smaller than Na and Nb (Nc<N<Na, Nb) because the time for the operation of the inspection means 60 and the time for the operation for housing the wafer in the cassette 71 are longer, the inspection means 60 and the housing means 70 may be additionally provided, or the functions of the inspection means 60 may be divided. In this case, an angle formed by the inspection means 60 and the housing part 70 may be 60°, if, for example, a total number of the inspection means 60 and the housing parts 70 is 4. Incidentally the angle is set at approximately 90° in this embodiment.

Moreover, in the above-mentioned embodiment, the position of the orientation flat or the notch of the wafer 10 (11) is roughly set by the pre-processing means 30, and is correctly reset before the wafer is mounted on the wafer table by the first carrying means 90, however, the present invention is not limited to this. It is possible to correctly set the position of the wafer at the pre-processing means 30 and to carry the correctly positioned wafer to the first carrying means 90 directly.

Furthermore, in the above-mentioned embodiment, the wafer 10 (11) is cleaned and the shape and size, etc. are inspected after the wafer is chamfered, and then the wafer is housed in the cassette 71. However, the present invention is not limited to this. It is possible to omit the inspection part 60. That is, the wafer 10 (11) is cleaned and housed in the cassette 71 without the measurement of the shape and size, etc., and the wafer 10 (11) is housed in a water tank, etc. after the chamfering is completed and the wafer is picked out from the water tank for inspecting later.

As has been described above, according to the chamfer grinding system for the wafer of the present invention, a plurality of chamfering means are provided so that the chamfering can be performed at the same time by the plural chamfering means, which can carry out the whole chamfering of the outer periphery of the wafer. That is, it is not required for the wafer including the notch to chamfer the circular part and the notch in two chamfer grinding systems or at two chamfering means in one chamfer grinding system for increasing the throughput. Moreover, it is not required to perform a rough edge grinding and a fine edge grinding in two chamfer grinding systems or at two chamfering means in one chamfer grinding system for improving the accuracy.

Furthermore, once the wafer is fixed at the wafer table during chamfering, there is no need to move the wafer. As a result, a manufacturing accuracy can be raised. Therefore, it is possible to provide the chamfer grinding system for the wafer, in which the accuracy in chamfering the outer periphery of the wafer is high and the throughput is large.

Furthermore, it is possible to provide the chamfer grinding means for the wafer, which reduces the cost of equipments and the area where the system is installed, when compared with the case that the chamfering is carried out in two chamfer grinding systems.

It should be understood, however, that there is no intention to limit the invention to the specific forms disclosed, but on the contrary, the invention is to cover all modifications, alternate constructions and equivalents falling within the spirit and scope of the invention as expressed in the appended claims.

I claim:
1. A wafer chamfering machine comprising;
at least one supplying part in which a storage cassette containing a wafer is mounted;
a pre-setting part for measuring the thickness of a wafer which has not been chamfered, and for setting a circumferential directional position of said wafer;
a plurality of processing parts for chamfering an outer circumference of said wafer, said processing parts having a delivering part;
a cleaning part for cleaning the wafer after it has been chamfered;
a post-measuring part for measuring a shape and size of the wafer after it has been cleaned and chamfered;
a storage part at which a storage cassette is disposed for containing the wafer after it has been measured;
said supplying part having a delivering part for picking up wafers one by one from said storage cassette mounted in said supplying part and delivering the picked-up wafers to said pre-setting part, and for delivering said wafer from said pre-setting part to the delivering part of said processing parts after it has been pre-set by said pre-setting part;
said delivering part of said processing parts receiving said wafer delivered by said delivering part of said supplying part, and supplying the received wafer to a one of said processing parts which is not chamfering another wafer while another of said processing parts is chamfering another wafer;
said cleaning part having a delivering part for picking up wafers chamfered by said processing parts, and for delivering said wafers to said cleaning part; and
a delivering part of said storage part for picking up wafers cleaned by said cleaning part and delivering said wafers to said post-measuring part and for picking up wafers measured by said post-measuring part from said post-measuring part and storing said wafers in said storage cassette disposed at said storage part.

2. The wafer chamfering machine as defined in claim 1, wherein a number of said processing parts is provided which is an integral number that is less than the least value among Na, Nb and Nc determined in accordance with the formulas:

$$Na = (Ha + G + Hc)/(F + Fa)$$

$$Nb = (Ha + G + Hc)/(W + He)$$

$$Nc = (Ha + G + Hc)/(E + He)$$

where F is a time which it takes for said delivering part of said supplying part to pick up said wafer from said supplying cassette and deliver said wafer to said pre-setting part and for a pre-setting of said wafer at said pre-setting part to be completed; Fa is a time which it takes for said delivering part of said supplying part to deliver the wafer, which was pre-set by said pre-setting part, from said pre-setting part to said delivering part of said processing part; Ha is a time which it takes for said delivering part of said processing part to deliver the wafer, which was received from said delivering part of said supplying part, to said one of the processing parts; G is a time which it takes for said one of the processing parts to chamfer the wafer which was delivered by said delivering part of said processing parts; Hc is a time which it takes said delivering part of said cleaning part to pick up the chamfered wafer from said one of the processing parts and deliver said wafer to said cleaning part; W is a time which it takes said cleaning part to clean the wafer which was delivered by said delivering part of said cleaning part; He is a time which it takes said delivering part of said storage part to pick up the cleaned wafer from said cleaning part; and E is a time which it takes said delivering part of said storage part to deliver the wafer, which was picked up from said cleaning part, to said post-measuring part and to store said wafer in said storage cassette mounted in said storage part after measurement at said post-measuring part.

3. The wafer chamfering machine as defined in claim 1, wherein an additional cleaning part is provided when N, Na, Nb and Nc have the following relations:

$N > Nb$ $N < Na, Nc$ where N is the number of processing parts and Na, Nb and Nc are determined in accordance with the formulas:

$Na = (Ha+G+Hc)/(F+Fa)$ $Nb = (Ha+G+Hc)/(W+He)$ $Nc = (Ha+G+Hc)/(E+He)$ where F is a time which it takes said delivering part of said supplying part to pick up said wafer from said supplying cassette and deliver said wafer to said pre-setting part and for a pre-setting of said wafer at said pre-setting part to be completed; Fa is a time which it takes for said delivering part of said supplying part to deliver the wafer, which was pre-set by said pre-setting part, from said pre-setting part to said delivering part of said processing parts; Ha is a time which it takes for said delivering part of said processing parts to deliver the wafer, which was received from said delivering part of said supplying part, to said one of the processing parts; G is a time which it takes for said one of the processing parts to chamfer the wafer which was delivered by said delivering part of said processing parts; Hc is a time which it takes said delivering part of said cleaning part to pick up the chamfered wafer from said one of the processing parts and deliver said wafer to said cleaning part; W is a time which it takes said cleaning part to clean the wafer which was delivered by said delivering part of said cleaning part; He is a time which it takes said delivering part of said storage part to pick up the cleaned wafer from said cleaning part; and E is a time which it takes said delivering part of said storage part to deliver the wafer, which was picked up from said cleaning part, to said post-measuring part and to store said wafer in said storage cassette mounted in said storage part after measurement at said post-measuring part.

4. The wafer chamfering machine as defined in claim 1, wherein at least one of an additional supplying part and an additional pre-setting part are provided when N, Na, Nb and Nc have the following relations:

$N > Na$ $N < Nb, Nc$ where N is the number of processing parts and Na, Nb and Nc are determined in accordance with the formulas:

$Na = (Ha+G+Hc)/(F+Fa)$ $Nb = (Ha+G+Hc)/(W+He)$ $Nc = (Ha+G+Hc)/(E+He)$ where F is a time which it takes said delivering part of said supplying part to pick up said wafer from said supplying cassette and deliver said wafer to said pre-setting part and for a pre-setting of said wafer at said pre-setting part to be completed; Fa is a time which it takes for said delivering part of said supplying part to deliver the wafer, which was pre-set by said pre-setting part, from said pre-setting part to said delivering part of said processing parts; Ha is a time which it takes for said delivering part of said processing parts to deliver the wafer, which was received from said delivering part of said supplying part, to said one of the processing parts; G is a time which it takes for said one of the processing parts to chamfer the wafer which was delivered by said delivering part of said processing parts; Hc is a time which it takes said delivering part of said cleaning part to pick up the chamfered wafer from said one of the processing parts and deliver said wafer to said cleaning part; W is a time which it takes said cleaning part to clean the wafer which was delivered by said delivering part of said cleaning part; He is a time which it takes said delivering part of said storage part to pick up the cleaned wafer from said cleaning part; and E is a time which it takes said delivering part of said storage part to deliver the wafer, which was picked up from said cleaning part, to said post-measuring part and to store said wafer in said storage cassette mounted in said storage part after measurement at said post-measuring part.

5. The wafer chamfering machine as defined in claim 1, wherein at least one of an additional post-measuring part and an additional storage part are provided when N, Na, Nb and Nc have the following relations:

$N > Nc$ $N < Na, Nb$ where N is the number of processing parts and Na, Nb and Nc are determined in accordance with the formulas:

$Na = (Ha+G+Hc)/(F+Fa)$ $Nb = (Ha+G+Hc)/(W+He)$ $Nc = (Ha+G+Hc)/(E+He)$ where F is a time which it takes said delivering part of said supplying part to pick up said wafer from said supplying cassette and deliver said wafer to said pre-setting part and for a pre-setting of said wafer at said pre-setting part to be completed; Fa is a time which it takes for said delivering part of said supplying part to deliver the wafer, which was pre-set by said pre-setting part, from said pre-setting part to said delivering part of said processing parts; Ha is a time which it takes for said delivering part of said processing parts to deliver the wafer, which was received from said delivering part of said supplying part, to said one of the processing parts; G is a time which it takes for said one of the processing parts to chamfer the wafer which was delivered by said delivering part of said processing parts; Hc is a time which it takes said delivering part of said cleaning part to pick up the chamfered wafer from said one of the processing parts and deliver said wafer to said cleaning part; W is a time which it takes said cleaning part to clean the wafer which was delivered by said delivering part of said cleaning part; He is a time which it takes said delivering part of said storage part to pick up the cleaned wafer from said cleaning part; and E is a time which it takes said delivering part of said storage part to deliver the wafer, which was picked up from said cleaning part, to said post-measuring part and to store said wafer in said storage cassette mounted in said storage part after measurement at said post-measuring part.

6. The wafer chamfering machine as defined in claim 1, wherein said delivering part of said processing parts comprises means for setting a circumferential directional position of said wafer.

7. The wafer chamfering machine as defined in claim 1, wherein said processing parts comprise means for chamfering a circular part of said wafer and one of a notch and an orientation flat of said wafer.

8. The wafer chamfering machine as defined in claim 1, wherein said processing parts comprise means for rough chamfering and fine chamfering of said wafer.

* * * * *